US009634157B2

(12) United States Patent
Sugimoto et al.

(10) Patent No.: US 9,634,157 B2
(45) Date of Patent: Apr. 25, 2017

(54) THIN-FILM SOLAR CELL MODULE AND METHOD FOR MANUFACTURING THE SAME

(71) Applicant: Solar Frontier K.K., Tokyo (JP)

(72) Inventors: Hiroki Sugimoto, Tokyo (JP); Keisuke Ishikawa, Tokyo (JP); Masashi Kondou, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 211 days.

(21) Appl. No.: 14/359,616

(22) PCT Filed: Nov. 22, 2012

(86) PCT No.: PCT/JP2012/080382
§ 371 (c)(1),
(2) Date: May 21, 2014

(87) PCT Pub. No.: WO2013/077431
PCT Pub. Date: May 30, 2013

(65) Prior Publication Data
US 2014/0332070 A1 Nov. 13, 2014

(30) Foreign Application Priority Data
Nov. 25, 2011 (JP) .................. 2011-257927

(51) Int. Cl.
*H01L 31/0224* (2006.01)
*H01L 27/142* (2014.01)
(Continued)

(52) U.S. Cl.
CPC ............... *H01L 31/022425* (2013.01); *H01L 31/03923* (2013.01); *H01L 31/0463* (2014.12);
(Continued)

(58) Field of Classification Search
CPC .................... H01L 31/022425; H01L 31/0463
See application file for complete search history.

(56) References Cited

U.S. PATENT DOCUMENTS

| 2009/0020157 A1 | 1/2009 | Krasnov et al. |
| 2010/0218827 A1 | 9/2010 | Aono et al. |
(Continued)

FOREIGN PATENT DOCUMENTS

| JP | 2004-140307 | 5/2004 |
| JP | 2005-515639 | 5/2005 |
(Continued)

OTHER PUBLICATIONS

Extended European Search Report dated May 20, 2015.

*Primary Examiner* — Seahvosh Nikmanesh
(74) *Attorney, Agent, or Firm* — IPUSA, PLLC

(57) ABSTRACT

A method for manufacturing a thin-film solar cell module includes a rear surface electrode layer deposition step for depositing a rear surface electrode layer on a substrate, an alkali metal adding step for adding an alkali metal to the rear surface electrode layer, a light absorbing layer deposition step for depositing a light absorbing layer on the rear surface electrode layer, a division groove forming step for forming a division groove that divides the light absorbing layer and exposing a front surface of the rear surface electrode layer in the division groove, an alloying step for alloying the rear surface electrode layer and the alkali metal on the front surface of the rear surface electrode layer exposed in the division groove, and a transparent conductive film deposition step for depositing a transparent conductive film on the light absorbing layer and in the division groove.

15 Claims, 8 Drawing Sheets

(51) Int. Cl.
*H01L 31/18* (2006.01)
*H01L 31/0392* (2006.01)
*H01L 31/0463* (2014.01)

(52) U.S. Cl.
CPC ............ *H01L 31/18* (2013.01); *Y02E 10/541* (2013.01); *Y02P 70/521* (2015.11)

(56) References Cited

U.S. PATENT DOCUMENTS

| | | |
|---|---|---|
| 2010/0224249 A1 | 9/2010 | Fukunaga et al. |
| 2011/0186131 A1 | 8/2011 | Mukai et al. |
| 2011/0240118 A1 | 10/2011 | Beatty |
| 2012/0258562 A1 | 10/2012 | Hakuma et al. |
| 2012/0306040 A1* | 12/2012 | Yuya ................ H01L 31/03928 257/443 |

FOREIGN PATENT DOCUMENTS

| | | |
|---|---|---|
| JP | 2011-129631 | 6/2011 |
| JP | 2011-165864 | 8/2011 |
| JP | 2011-199142 | 10/2011 |
| WO | WO 03/061013 | 7/2003 |

* cited by examiner

THIN-FILM SOLAR CELL MODULE AND METHOD FOR MANUFACTURING THE SAME

TECHNICAL FIELD

The present invention relates to a thin-film solar cell module having multiple cells connected in series and method for manufacturing thereof.

BACKGROUND ART

In recent years, solar power generation, which does not require fuel or emit greenhouse effect gas, is drawing attention. As for known thin-film solar cell modules used for solar power generation, there are, for example, a thin-film silicon such as amorphous silicon or microcrystal silicon or a thin-film compound such as a thin-film CIS based compound.

For example, a CIS based thin-film solar cell module includes a substrate on which a rear surface electrode layer, a light absorbing layer, and a transparent conductive film are sequentially layered to serve as power generation elements. These layers are divided into multiple cells by multiple division grooves and are configured to be serially connected to each other. For example, a mechanical scribing method that uses a needle and a laser scribing method that uses a laser are known to be methods for forming the division grooves by removing the light absorbing layer on the rear surface electrode layer (see, for example, Patent Document 1).

Further, in order to improve the efficiency of the CIS based thin-film solar cell module, there is a known technique of adding an alkali metal such as sodium (Na) to the light absorbing layer during the forming of the light absorbing layer. A portion of the alkali metal (e.g., sodium (Na)) added to the light absorbing layer spreads throughout the rear surface electrode layer and remains in the rear surface electrode layer. In other words, the rear surface electrode layer is formed to include an alkali metal such as sodium (Na) (see, for example, Patent Document 2).

RELATED ART REFERENCE

Patent Document

Patent Document 1: Japanese Laid-Open Patent Publication No. 2011-165864
Patent Document 2: Japanese Laid-Open Patent Publication No. 2011-129631

DISCLOSURE OF THE INVENTION

Problems to be Solved by the Invention

However, the inventors of the present invention have found that a characteristic of the thin-film solar cell module referred to as a fill factor (FF) is degraded more than anticipated in a case where the method disclosed in Patent Document 1 is used to form division grooves in the thin-film solar cell module having added an alkali metal such as sodium (Na) to the light absorbing layer as disclosed in Patent Document 2.

The inventors consider that the reason of the degradation of the characteristic is the increase of resistance value at a division groove part resulting from the alkali metal (e.g., sodium (Na)) of the rear surface electrode layer spreading to a part of the transparent conductive film in the division groove part at which the transparent conductive film is formed.

In view of the above, the present invention is aimed to provide a thin-film solar cell module and a method for manufacturing the same for preventing characteristic degradation.

Means of Solving the Problems

A method for manufacturing a thin-film solar cell module is to include a rear surface electrode layer deposition step for depositing a rear surface electrode layer on a substrate, an alkali metal adding step for adding an alkali metal to the rear surface electrode layer, a light absorbing layer deposition step for depositing a light absorbing layer on the rear surface electrode layer, a division groove forming step for forming a division groove that divides the light absorbing layer and exposing a front surface of the rear surface electrode layer in the division groove, an alloying step for alloying the rear surface electrode layer and the alkali metal on the front surface of the rear surface electrode layer exposed in the division groove, and a transparent conductive film deposition step for depositing a transparent conductive film on the light absorbing layer and in the division groove.

A thin-film solar cell module is to include a substrate, a rear surface electrode layer deposited on the substrate, a light absorbing layer deposited on the rear surface electrode layer, a division groove that divides the light absorbing layer and exposes a front surface of the rear surface electrode layer, and a transparent conductive film deposited on the light absorbing layer and in the division groove, wherein an alkali metal is added to the rear surface electrode layer, wherein an alloy of the rear surface electrode layer and the alkali metal is formed in the front surface of the rear surface electrode layer exposed in the division groove.

Effects of the Invention

With the disclosed art, there can be provided a solar cell module and its manufacturing method that can prevent characteristic degradation.

EMBODIMENTS FOR CARRYING OUT THE INVENTION

Figure 1:
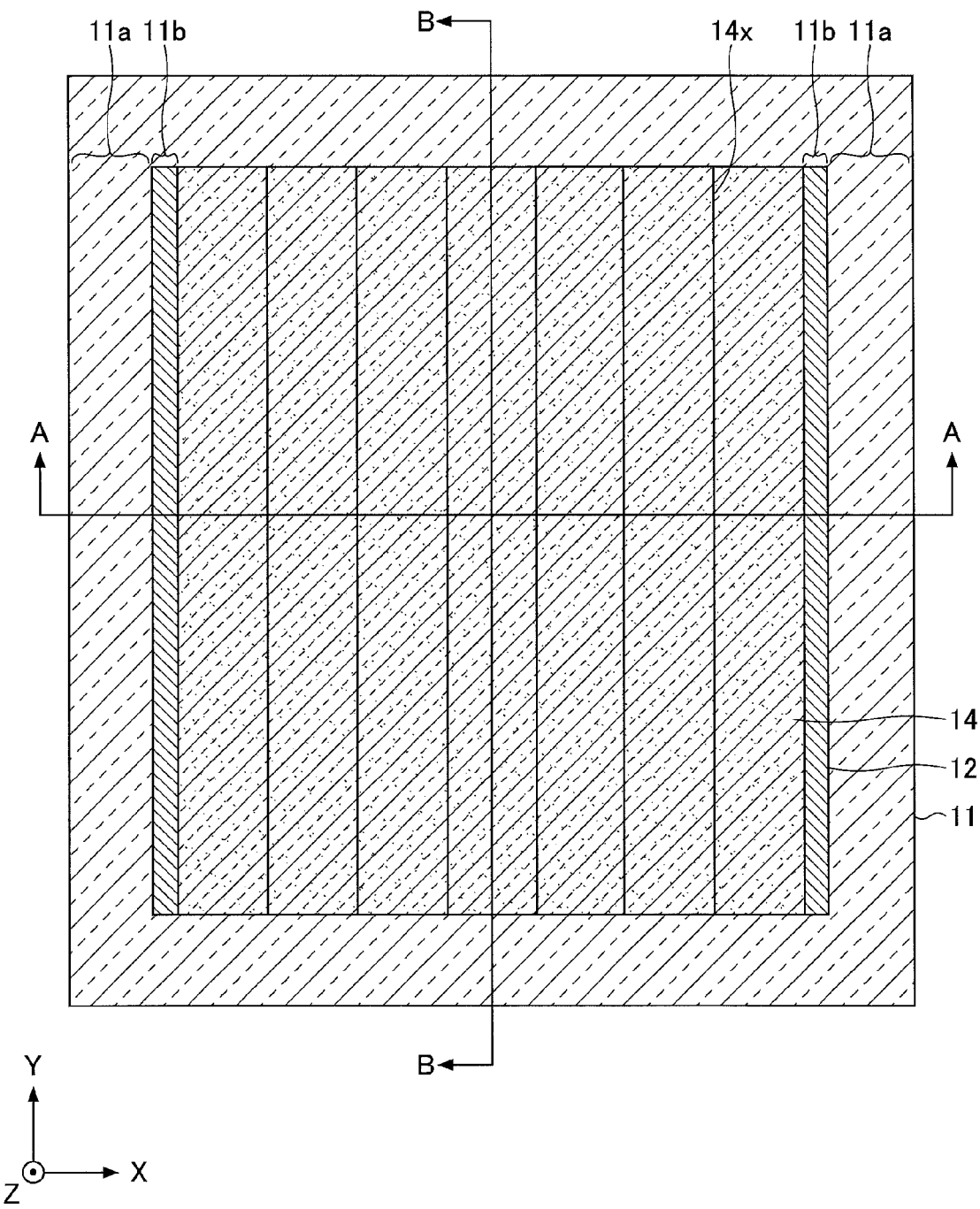
FIG. 1 is a plan view illustrating a CIS based thin-film solar cell module according to an embodiment of the present invention.

Next, embodiments for carrying the present invention are described with reference to the accompanying drawings. Same components are denoted with same reference numerals throughout the drawings and redundant explanation thereof may be omitted.

It is to be noted that, although the following embodiments are described by using an example of a CIS based thin-film solar cell module, the present invention may also be applied to other thin-film solar cell modules besides the CIS based thin-film solar cell module. As for examples of other applicable thin-film solar cell modules, there are an amorphous silicon based thin-film solar cell module, a microcrystal silicon based thin-film solar cell module, and a compound based thin-film solar cell module other than the CIS based thin-film solar cell module.

The compound based thin-film solar cell module other than the CIS based thin-film solar cell module may be, for example, a CZTS based thin-film solar cell module having a light absorbing layer that includes a compound containing copper (Cu), zinc (Zn), tin (Sn), and a chalcogen element (selenium (Se) or sulfur (S)) or a CdTe based thin-film solar cell module having a light absorbing layer that includes a compound containing cadmium (Cd) and tellurium (Te).

<Structure of CIS Based Thin-film Solar Cell Module According to an Embodiment of the Present Invention>

Figure 2:
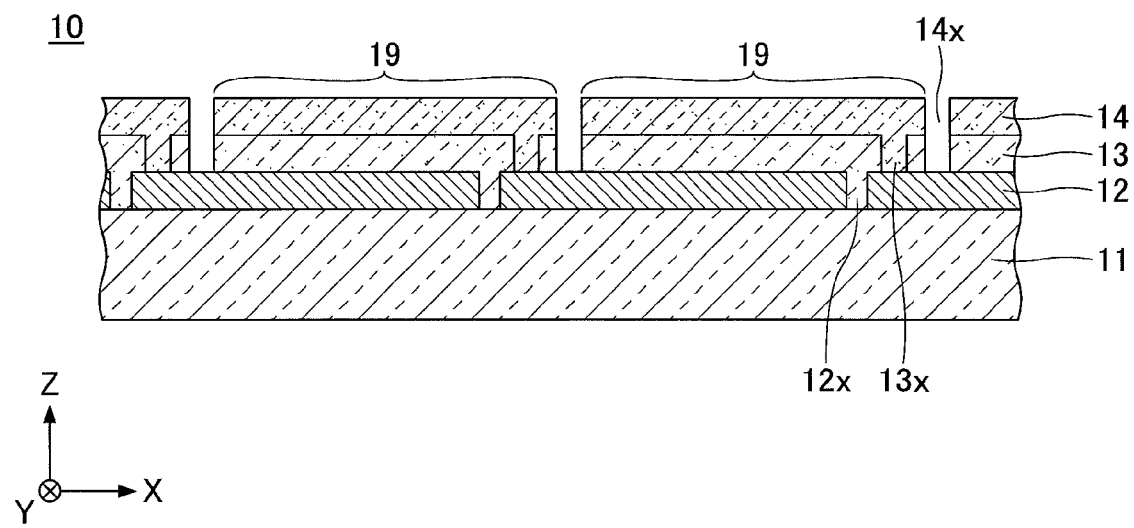
FIG. 2 is a partial cross-sectional view taken along line A-A of FIG. 1.
Figure 3:
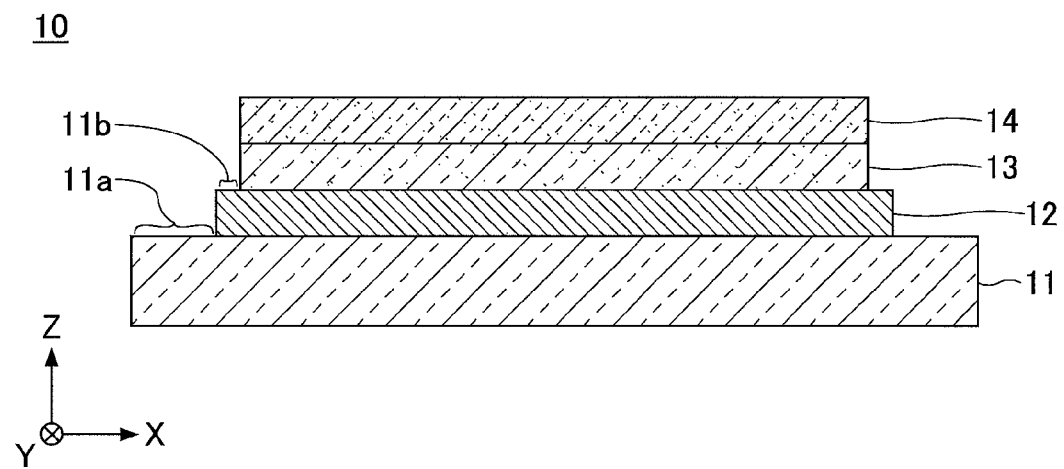
FIG. 3 is a cross-sectional view taken along line B-B of FIG. 1.

First, a structure of the CIS based thin-film solar cell module according to an embodiment of the present invention is described. FIG. 1 is a plan view illustrating the CIS based thin-film solar cell module according to an embodiment of the present invention. FIG. 2 is a partial cross-sectional view taken along line A-A of FIG. 1. FIG. 3 is a cross-sectional view taken along line B-B of FIG. 1.

Each of the drawings illustrates an example where a plan-view shape of the CIS based thin-film solar cell module is a rectangular shape. In a case of viewing the CIS based thin-film solar cell module from a plan view (viewing from the side of a light receiving surface), the transverse direction is assumed to be the X direction, the longitudinal direction is assumed to be the Y direction, and the thickness direction is assumed to be the Z direction. For the sake of convenience, the hatchings used for cross-sectional views are also used for the plan view.

With reference to FIGS. 1 to 3, the CIS based thin-film solar cell module 10 includes a substrate 11, a rear surface electrode 12, a light absorbing layer 13, and a transparent conductive film 14. The rear surface electrode 12, the light absorbing layer 13, and the transparent conductive film 14 are sequentially layered on the substrate 11. Next, each of the elements constituting the CIS based thin-film solar cell module 10 are described.

The substrate 11 is a portion serving as a base on which the rear surface electrode layer 12, the light absorbing layer 13, and the transparent conductive film 14 are formed. For example, a glass substrate of blue-board glass, low alkali glass, or the like, a metal substrate of stainless or the like, or a resin substrate of epoxy resin or the like may be used as the substrate 11. The thickness of the substrate 11 may be, for example, approximately a few mm.

The rear surface electrode layer 12 is formed on the substrate 11. The rear surface electrode layer 12 is divided by division grooves $12x$ provided along the Y direction. The width of the division groove $12x$ may be, for example, approximately a few 10s to a few 100s μm.

For example, molybdenum (Mo) may be used as the rear surface electrode layer 12. Titanium (Ti) or chromium (Cr), which is resistant to selenium (Se) or sulfur (S), may also be used as the rear surface electrode layer 12. The thickness of the rear surface electrode layer 12 is, for example, approximately few 10s of nm to a few μm. The rear surface electrode layer 12 is a layer that is to be one of the electrodes of the CIS based thin-film solar cell module 10.

The light absorbing layer 13 is a layer formed of a p-type semiconductor. The light absorbing layer 13 is formed on the rear surface electrode layer 12 and in the division groove $12x$. The light absorbing layer 13 is divided by division grooves $13x$ provided along the Y direction. The width of the division groove $13x$ may be, for example, approximately a few 10s to a few 100 μm. The light absorbing layer 13 is a part where photoelectric conversion is performed on radiated sun light or the like. The electromotive force generated by the photoelectric conversion at the light absorbing layer 13 can be externally extracted as electric current from an electrode ribbon (copper foil ribbon) attached to each of the rear surface electrode layer 13 and the transparent conductive film 14 by solder or the like.

For example, a compound formed of copper (Cu), indium (In), and selenium (Se) or a compound formed of copper (Cu), indium (In), gallium (Ga), selenium (Se), and sulfur (S) may be used as the light absorbing layer 13.

Examples of the compounds may be $CuInSe_2$, $Cu(InGa)Se_2$, or $Cu(InGa)(SSe)_2$. The thickness of the light absorbing layer 13 may be, for example, a few μm to a few 10s μm.

An alkali metal such as sodium (Na) or the like may be added to the light absorbing layer 13. By adding an alkali metal such as Na or the like, photoelectric conversion efficiency can be improved. It is to be noted that the same effect can be attained even where an alkali metal such as lithium (Li), potassium (K), or the like is added instead of Na.

It is to be noted that a buffer layer (not illustrated) may be formed on a front surface of the light absorbing layer 13. The buffer layer is a high resistance layer having a function of preventing current from leaking from the light absorbing layer 13. For example, a zinc compound, zinc sulfide (ZnS), cadmium sulfide (CdS), indium sulfide (InS) or the like may be used as the material of the buffer layer. The thickness of the buffer layer may be, for example, approximately 5 to 50 nm.

The transparent conductive film 14 is a transparent layer formed of an n-type semiconductor. The transparent conductive film 14 is formed on the light absorbing layer 13 and in the division groove $13x$. For example, a zinc oxide based thin-film (ZnO) or an indium tin oxide (ITO) thin film or the like may be used as the transparent conductive film 14. In a case of using a zinc oxide based thin-film (ZnO), it is preferable to add boron (B), aluminum (Al), gallium (Ga) or the like as a dopant, so that resistance can be lowered. The thickness of the transparent conductive film 14 may be, for example, approximately a few μm to a few 10s μm. The light absorbing layer 13 and the transparent conductive film 14 form a pn junction. The transparent conductive film 14 is to be used as the other electrode of the CIS based thin-film solar cell module 10.

The light absorbing layer 13 and the transparent conductive film 14 are divided by division grooves 14x provided along the Y direction. The width of the division groove 14x is, for example, approximately a few 10 μm to a few 100 μm. The parts divided by the division grooves 14x constitute a plurality of cells 19, respectively. The transparent conductive film 14 formed in the division groove 13x of a predetermined cell 19 is electrically connected to the rear surface electrode layer 12 of an adjacent cell 19. That is, the plurality of cells 19 divided by the division groove 14x are connected in series.

Neither the rear surface electrode layer 12 nor the light absorbing layer 13 is formed but a first edge space 11a including an exposed front surface of the substrate 11 is formed on both edge parts of the substrate 11 in the X direction. Further, no light absorbing layer 13 is formed but a second edge space 11b including an exposed front surface of the rear surface electrode layer 12 is formed at an inner side of the first edge space 11a. The second edge space 11b is provided for attaching the above-described electrode ribbon (copper foil ribbon) to the rear surface electrode layer 12. The width of the first edge space 11a is preferably 10 mm or more. The width of the second edge space 11b is preferably 1 mm or more.

<Method for Manufacturing CIS Based Thin Film Solar Cell Module According to an Embodiment of the Present Invention>

Next, a method for manufacturing a CIS based thin film solar cell module according to an embodiment of the present invention is described. FIGS. 4 to 9 are diagrams illustrating processes of manufacturing a CIS based thin-film solar cell module according to an embodiment of the present invention. It is to be noted that FIGS. 4-9 are partial cross-sectional views corresponding to a cross section taken along line A-A of FIG. 1.

Figure 4:
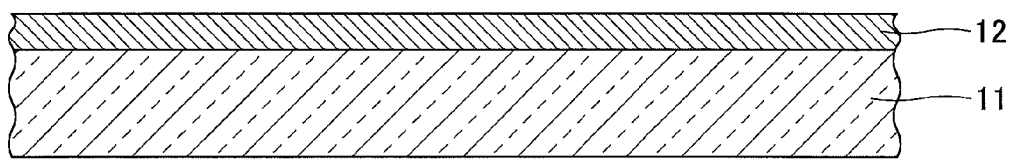
FIG. 4 is a diagram illustrating a process of manufacturing a CIS based thin-film solar cell module according to an embodiment of the present invention (part 1)
Figure 4:
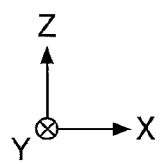

First, in the process illustrated in FIG. 4, the rear surface electrode layer 12 is faulted on the substrate 11. More specifically, first, the substrate 11 is prepared. For example, a glass substrate of blue-board glass, low alkali glass, or the like, a metal substrate of stainless or the like, or a resin substrate of epoxy resin or the like may be used as the substrate 11. The thickness of the substrate 11 may be, for example, approximately a few mm.

Then, the rear surface electrode layer 12 is deposited on the substrate 11 by, for example, a sputtering method. For example, molybdenum (Mo) may be used as the rear surface electrode layer 12. Titanium (Ti) or chromium (Cr), which is resistant to selenium (Se) or sulfur (S), may also be used as the rear surface electrode layer 12. The thickness of the rear surface electrode layer 12 may be, for example, approximately few 10s of nm to a few μm.

Figure 5:
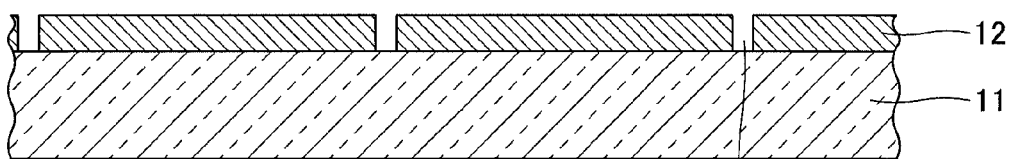
FIG. 5 is a diagram illustrating a process of manufacturing a CIS based thin-film solar cell module according to an embodiment of the present invention (part 2)
Figure 5:
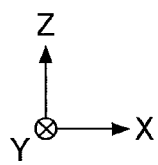

Then in the process illustrated in FIG. 5, division grooves 12x, which divide the rear surface electrode layer 12, are formed in the Y direction. The front surface of the substrate 11 is exposed in the division groove 12x. For example, a pulsed laser beam may be radiated to a part of the rear surface electrode layer 12 by using a YAG laser or the like, so that the radiated part of the rear surface electrode layer 12 is removed, to thereby form the division groove 12x. The width of the division groove 12x may be, for example, approximately few 10 μm to a few 100 μm.

Figure 6:
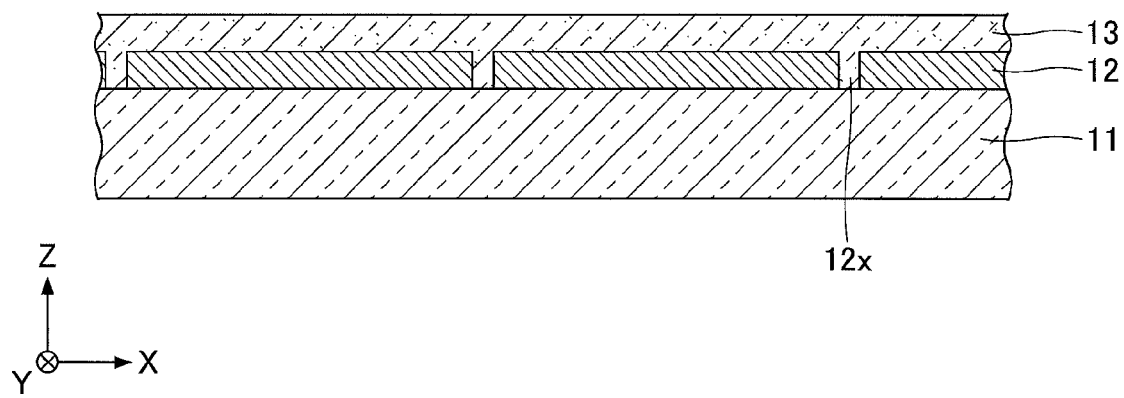
FIG. 6 is a diagram illustrating a process of manufacturing a CIS based thin-film solar cell module according to an embodiment of the present invention (part 3)

Then, in the process illustrated in FIG. 6, the light absorbing layer 13 is formed on the rear surface electrode layer 12 and in the division groove 12x. The light absorbing layer 13 may be deposited by using, for example, a sputtering method or a vapor deposition method that forms a precursor film including copper (Cu), gallium (Ga), indium (In) and performs a thermal process in a selenium (Se) atmosphere, a sulfur (S) atmosphere, or an atmosphere of selenium (Se) and sulfur (S).

The light absorbing layer 13 may be deposited by vapor deposition of copper (Cu), gallium (Ga), indium (In), and selenium (Se). Alternatively, the light absorbing layer 13 may be deposited by vapor deposition of copper (Cu), gallium (Ga), indium (In), and sulfur (S). Alternatively, the light absorbing layer 13 may be deposited by vapor deposition of copper (Cu), gallium (Ga), indium (In), selenium (Se) and sulfur (S).

In this embodiment, an alkali metal such as sodium (Na), lithium (Li), or potassium (K) is added to the light absorbing layer 13. The following describes an example of using Na as the alkali metal.

For example, in order to add Na to the light absorbing layer 13, a precursor film material (e.g., CuGa) along with Na may be added to a sputter target or vapor deposition source at a timing of forming a precursor film on the rear surface electrode layer 12. For example, a CuGa film including Na may be deposited on the rear surface electrode layer 12 by using a sputter target of a CuGa alloy including NaF. On top of this, an In film is deposited by using an In sputter target. Thereby, a precursor film including Na is formed.

Then, in a process of forming selenide or sulfide, the light absorbing layer 13 can attain a satisfactory crystal quality by spreading the Na included in the precursor film to the light absorbing layer 13. However, the Na to be included in the sputter target is not limited to NaF. A single element of Na or other compounds of Na may also be used. Further, Na or a Na compound such as NaF may be included in an In sputter target or a Cu sputter target instead of including Na in a sputter target of a CuGa alloy. Further, Na may be added to a vapor deposition source or Na may be used as a vapor deposition source.

It is to be noted that a part of an alkali metal such as Na added to the light absorbing layer 13 spreads to the rear surface electrode layer 12 and remains in the rear surface electrode layer 12.

Instead of the above-described methods, an alkali metal may be directly added to the rear surface electrode layer 12 as a method for adding an alkali metal such as sodium (Na) to the light absorbing layer 13. For example, in the process illustrated in FIG. 4, Na may be added into the rear surface electrode layer 12 by forming the rear surface electrode layer 12 by performing a sputtering method using a Mo target including Na. Accordingly, the light absorbing layer 13 can be formed to have satisfactory crystal quality because a part of the Na included in the rear surface electrode layer 12 spreads to the light absorbing layer 13 during the deposition of the light absorbing layer 13.

Further, as another method for adding an alkali metal such as sodium (Na) to the light absorbing layer 13, a glass substrate including an alkali metal such as Na may be used as a substrate, so that the alkali metal included in the glass substrate can spread to the light absorbing layer 13. More specifically, in a process of forming selenide or sulfide during the deposition of the light absorbing layer 13, an alkali metal included in a glass substrate is spread to the rear surface electrode layer 12. In addition, a part of the alkali metal that has been spread to the rear surface electrode layer 12 spreads to the light absorbing layer 13. As a result, the light absorbing layer 13 is formed having a satisfactory crystal quality.

Hence, an "alkali metal adding step for adding an alkali metal to a rear surface electrode layer" according to an embodiment of the present invention is not required to be a single independent step and may be included in a step of, for example, depositing the light absorbing layer 13.

It is to be noted that a buffer layer may be deposited on the front surface of the light absorbing layer 13 according to necessity. For example, the buffer layer may be deposited on the front surface of the light absorbing layer 13 by using a crystal of CdS, InS, In (O, S, OH), or Zn (O, S, OH), ZnO, ZnS, or a crystal of these elements as a material and performing a solution growth method (CBD method), a metal organic chemical vapor deposition method (MOCVD method), an atomic layer deposition method (ALD method) or the like. The thickness of the buffer layer may be, for example, approximately 5 to 50 nm.

Figure 7:
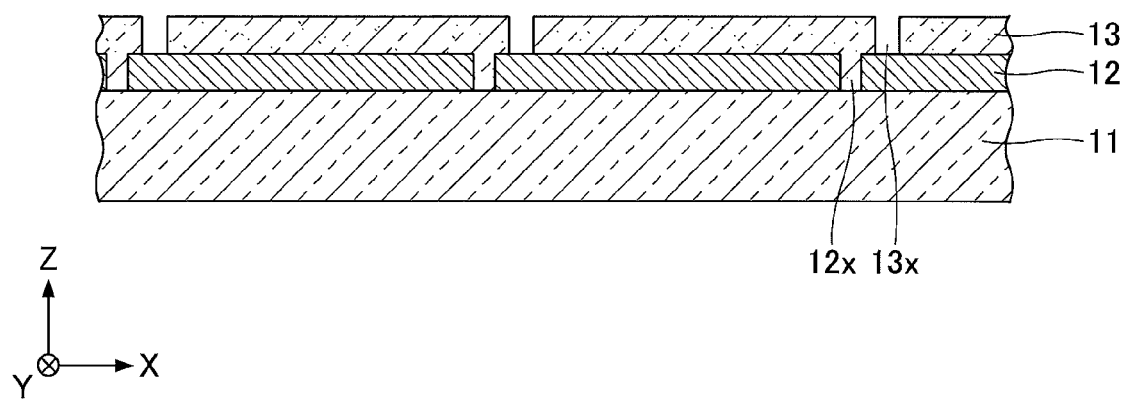
FIG. 7 is a diagram illustrating a process of manufacturing a CIS based thin-film solar cell module according to an embodiment of the present invention (part 4)

Then, in the process illustrated in FIG. 7, the division grooves 13x that divide the light absorbing layer 13 in the Y direction are formed. The front surface of the rear surface electrode layer 12 is exposed in the division groove 13. For example, a pulsed laser beam may be radiated to a part of the light absorbing layer 13 by using a YAG laser or the like, so that the radiated part of the light absorbing layer 13 is removed, to thereby foam the division groove 13x. The width of the division groove 13x may be, for example, approximately few 10 μm to a few 100 μm.

In a case of using the YAG laser, its wavelength is preferably 1064 nm and its pulse width is preferably 12 ns or more. Further, besides a primary wavelength of 1064 nm, the YAG laser may also use second harmonic wave (532 nm) and a third high harmonic wave (355 nm) that have a pulse width of 12 ns or more.

At the front surface of the rear surface electrode layer 12 exposed in the division groove 13x, the rear surface electrode layer 12 and the Na included in the rear surface electrode layer 12 are alloyed by the above-described laser that is used during the forming of the division grooves 13x for removing the light absorbing layer 13. The alloy that is formed is, for example, $Na_2MoO_4$, $Na_2Mo_2O_7$, $Na_2Mo_3O_6$, $Na_4MoO_5$ or the like.

Thus, in order for the rear surface electrode layer 12 and the Na included in the rear surface electrode layer 12 to be alloyed to each other, it is necessary to use a laser having the above-described pulse width (pulse width 12 ns). It is to be noted that the specific effects attained by alloying the rear surface electrode layer 12 and the Na included in the rear surface electrode layer 12 are explained using the below-described working examples.

Figure 8:
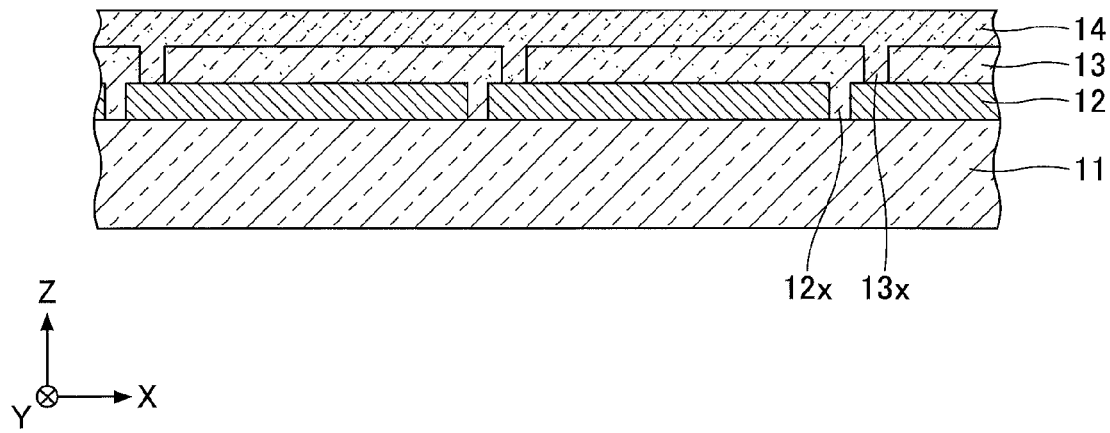
FIG. 8 is a diagram illustrating a process of manufacturing a CIS based thin-film solar cell module according to an embodiment of the present invention (part 5)

Then, in the process illustrated in FIG. 8, the transparent conductive film 14 is formed on the light absorbing layer 13 and in the division grooves 13x. The transparent conductive film 14 may be deposited by using a MOCVD method or a sputtering method to form a transparent low resistance film such as a zinc oxide based thin film (ZnO) having added boron (B), gallium (Ga), aluminum (Al) as a dopant or a ITO (Indium Tin Oxide) thin film. The thickness of the transparent conductive film 14 may be, for example, approximately a few μm to a few 10s μm.

Figure 9:
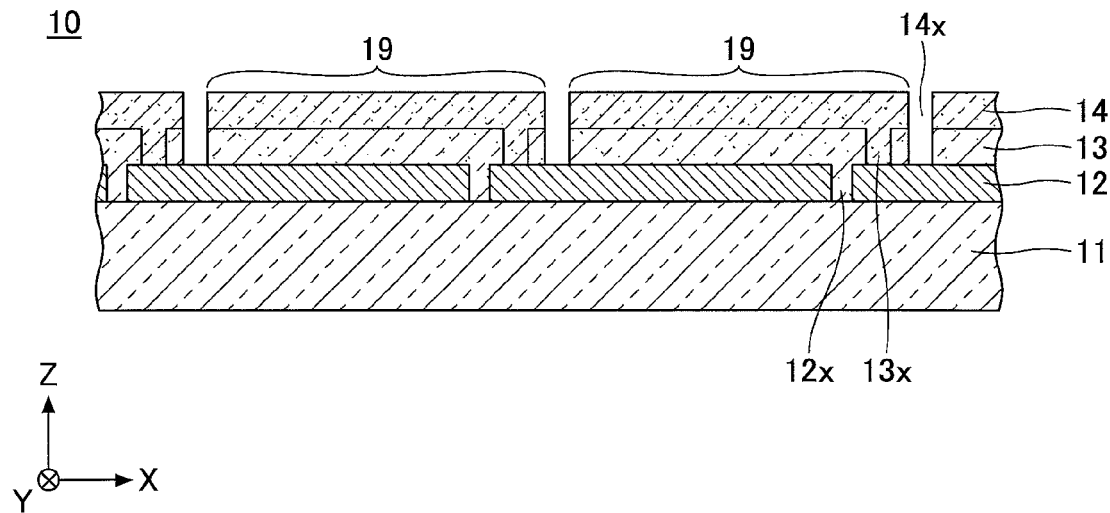
FIG. 9 is a diagram illustrating a process of manufacturing a CIS based thin-film solar cell module according to an embodiment of the present invention (part 6)

Then, in the process illustrated in FIG. 9, the division grooves 14x that divide the light absorbing layer 13 and the transparent conductive film 14 in the Y direction are formed. The front surface of the rear surface electrode layer 12 is exposed in the division groove 14x. For example, a pulsed laser beam may be radiated to a part of the light absorbing layer 13 and a part of the transparent conductive film 14 by using a YAG laser or the like, so that the radiated parts of the light absorbing layer 13 and the transparent conductive film 14 are removed, to thereby form the division grooves 14x. The width of the division groove 14x may be, for example, approximately few 10s μm to a few 100s μm. It is to be noted that the division groove 14x may be mechanically formed by using a needle or the like (mechanical scribe) instead of using a laser. By the above-described processes, the CIS based thin-film solar cell module 10 illustrated in FIGS. 1-3 is completed.

It is to be noted that, in the above-described process illustrated in FIG. 7, the division groove 13x is formed by removing the light absorbing layer 13 along with alloying the rear surface electrode layer 12 and the Na included in the rear surface electrode layer 12 at the front surface of the rear surface electrode layer 12 exposed in the division groove 13x. However, the forming of the division groove 13x and the alloying of Na may be performed in separate processes.

For example, after forming the division groove 13x by mechanical scribing, a YAG laser may be used to radiate a laser beam having a pulse width of 12 ns or more and a primary wavelength of 1064 nm, a secondary harmonic wave of 532 nm, or a third harmonic wave of 355 nm to the rear surface electrode layer 12 in the division groove 13x, to thereby alloy the rear surface electrode layer 12 and the Na included in the rear surface electrode layer 12 at the front surface of the rear surface electrode layer 12 exposed in the division groove 13x.

Further, after forming the division groove 13x by using a pulsed laser having a short pulse width that is less than 12 ns (e.g., a few ns), a YAG laser may be used to radiate a laser beam having a pulse width of 12 ns or more and a primary wavelength of 1064 nm, a secondary harmonic wave of 532 nm, or a third harmonic wave of 355 nm to the rear surface electrode layer 12 in the division groove 13x, to thereby alloy the rear surface electrode layer 12 and the Na included in the rear surface electrode layer 12 at the front surface of the rear surface electrode layer 12 exposed in the division groove 13x.

WORKING EXAMPLE

As working examples, the performance of CIS based thin-film solar cell modules are compared by changing the conditions for forming the division groove 13x.

First, the following 4 types of samples (sample 1-4) are fabricated. The sample 1 is a sample of a comparative example being a CIS based thin-film solar cell module that has the division groove 13x formed by a mechanical scribing method using a metal needle (hereinafter referred to as "comparative example 1"). The sample 2 is a sample of another comparative example being a CIS based thin-film solar cell module that has the division groove 13x formed by a laser having a pulse width of 9 ns (hereinafter referred to as "comparative example 2").

Sample 3 is a sample according to an embodiment of the present invention being a CIS based thin-film solar cell module that has the division groove 13x formed by a laser having a pulse width of 12 ns (hereinafter referred to as "working example 1"). Sample 4 is a sample according to another embodiment of the present invention being a CIS based thin-film solar cell module that has the division groove 13x formed by a laser having a pulse width of 15 ns (hereinafter referred to as "working example 2"). It is to be noted that the samples 1-4 are fabricated under the same conditions except for the division groove 13x.

Figure 10:
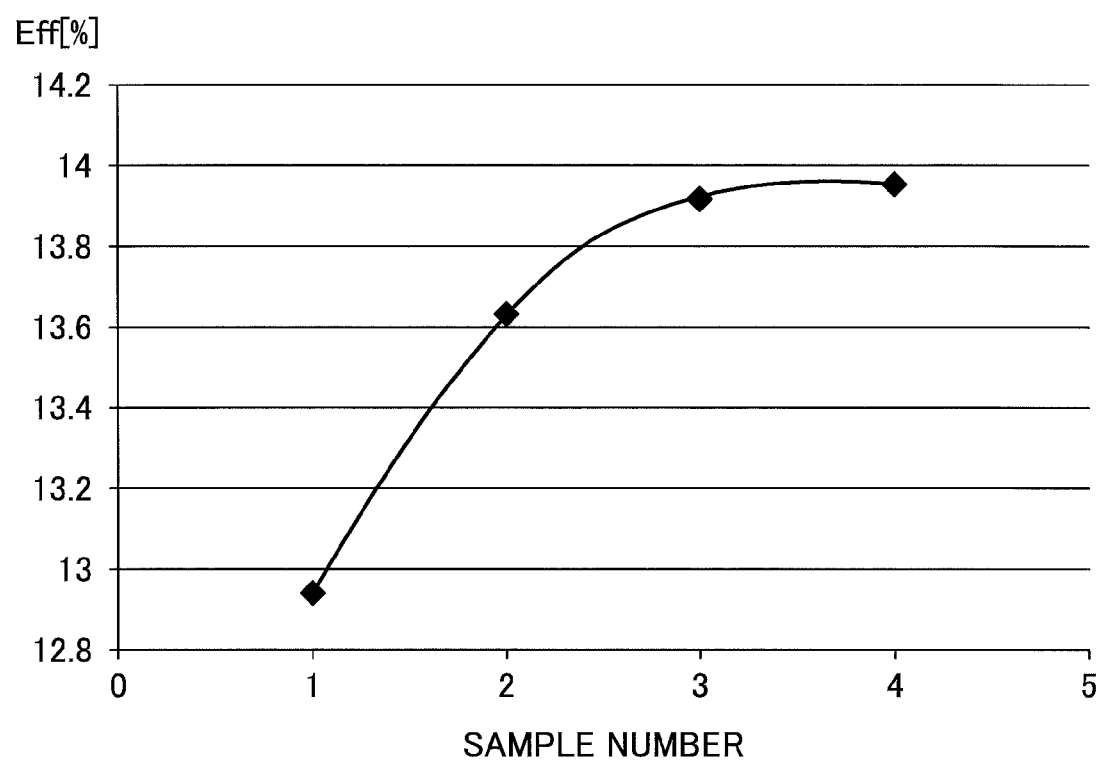
FIG. 10 is a diagram illustrating a conversion efficiency of each sample.

Table 1 and FIG. 10 illustrate the results of comparing the performance of thin-film solar cell modules with respect to the fabricated samples 1-4.

TABLE 1

| | FORMING CONDITION OF DIVISION GROOVE 13x | CONVERSION EFFICIENCY Eff [%] | FILL FACTOR FF |
|---|---|---|---|
| SAMPLE 1 (COMPARATIVE EXAMPLE 1) | MECHANICAL SCRIBE | 12.94 | 0.616 |
| SAMPLE2 (COMPARATIVE EXAMPLE 2) | LASER SCRIBE (PULSE WIDTH: 9 nsec) | 13.63 | 0.637 |
| SAMPLE3 (WORKING EXAMPLE 1) | LASER SCRIBE (PULSE WIDTH: 12 nsec) | 13.92 | 0.649 |
| SAMPLE4 (WORKING EXAMPLE 2) | LASER SCRIBE (PULSE WIDTH: 15 nsec) | 13.96 | 0.655 |

With reference to Table 1 and FIG. 10, the sample 1 having the division groove 13x formed by a mechanical scribe (comparative example 1) has a low fill factor FF compared to those of the sample 2 (comparative example 2) and the sample 3 (working example 1). As a result, the conversion efficiency Eff also becomes lower than 13.0%. Further, the sample 2 (comparative example 2) also has a low fill factor FF compared to those of the sample 3 (working example 1) and the sample 4 (working example 2). Thus, the conversion efficiency Eff thereof is also low.

The inventors find the following reasons to be the cause of preventing the improvement of the fill factor FF and the conversion efficiency Eff with respect to sample 1 (comparative example 1) and sample 2 (comparative example 2).

For example, in a case of adding an alkali metal such as Na to the light absorbing layer 13 during deposition of the light absorbing layer 13, a part of Na also spreads to the rear surface electrode layer 12. Further, in a case of using a glass substrate as the substrate 11, the alkali metal inside the glass substrate spreads to the light absorbing layer 13 via the rear surface electrode layer 12. Thereby, a part of the alkali metal remains in the rear surface electrode layer 12. Further, even in a case where an alkali metal is added to the light absorbing layer 13 besides from a glass substrate, a part of alkali metal spreads from the light absorbing layer 13 to the rear surface electrode layer 12 during deposition of the light absorbing layer 13.

After the division groove 13x is formed, the division groove 13x is filled by the transparent conductive film 14 during the deposition of the transparent conductive film 14 in the process illustrated in FIG. 8. As described above, because alkali metal is included in the rear surface electrode layer 12, the alkali metal included in the rear surface electrode layer 12 spreads to the part of the transparent conductive film 14 provided in the division groove 13x. Therefore, the resistivity at the part of the transparent conductive film 14 provided in the division groove 13x increases. Thus, the inventors find that this leads to degradation of fill factor FF due to increase of serial resistance and further leads to degradation of conversion efficiency Eff.

Further, degradation of fill factor FF and efficiency Eff due to spreading of alkali metal is significant because deposition process temperature is high in a case of depositing the transparent conductive film 14 with a MOCVD method compared to a case of depositing the transparent conductive film 14 with a sputtering method.

Based on the above-described observation, the inventors find that improvement of fill factor FF and photoelectric efficiency Eff can be achieved by alloying the rear surface electrode layer 12 and the alkali metal included in the rear surface electrode layer 12, so that the alkali metal can be prevented from spreading to the transparent conductive film 14.

According to the fill factor FF and the conversion efficiency Eff of the sample 2 (comparative example 2) illustrated in Table 1 and FIG. 10, it can be understood that merely forming the division groove 13x by using a laser is insufficient for alloying the alkali metal and the rear surface electrode layer 12.

Further, according to the fill factor FF and the conversion efficiency Eff of the sample 3 (working example 1) and the sample 4 (working example 2) illustrated in Table 1 and FIG. 10, it can be understood that alloying of alkali metal is possible by setting a laser with a pulse width no less than a predetermined value (12 ns or more). As a result, alkali metal can be prevented from spreading to the transparent conductive film 14.

Figure 11:
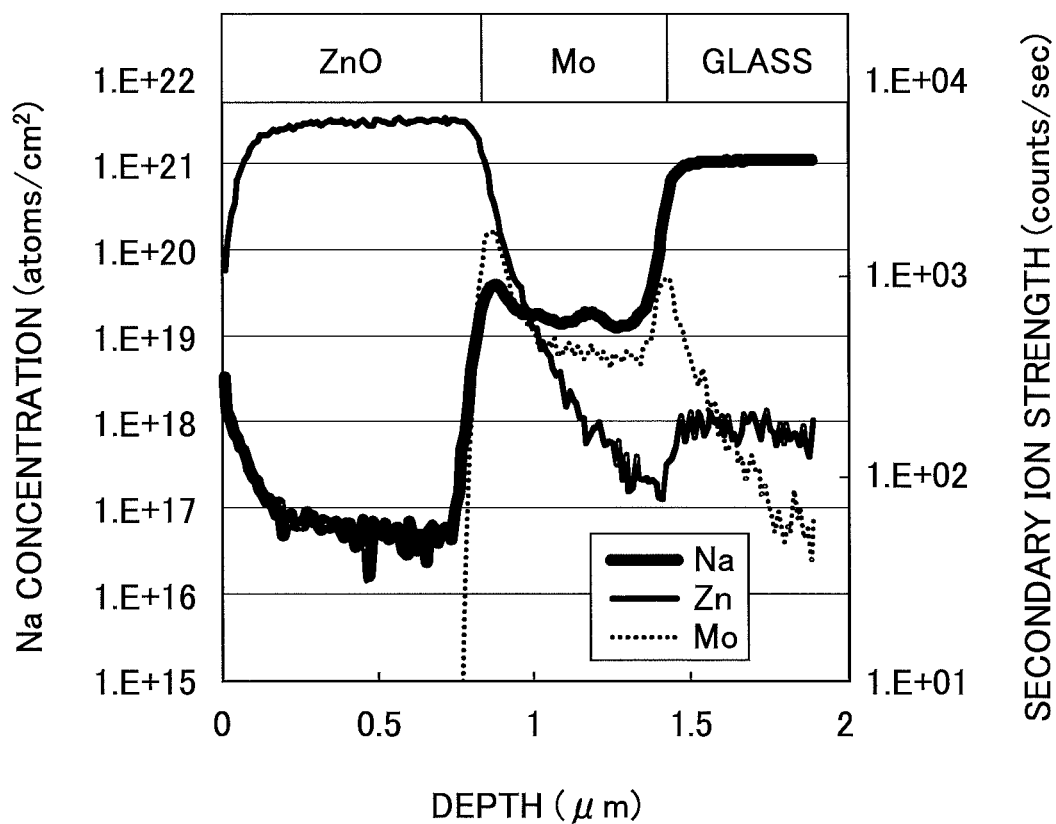
FIG. 11 is a diagram illustrating the effect of preventing alkali metal from spreading to a transparent conductive film due to alloying of alkali metal and a rear surface electrode layer (part 1)
Figure 12:
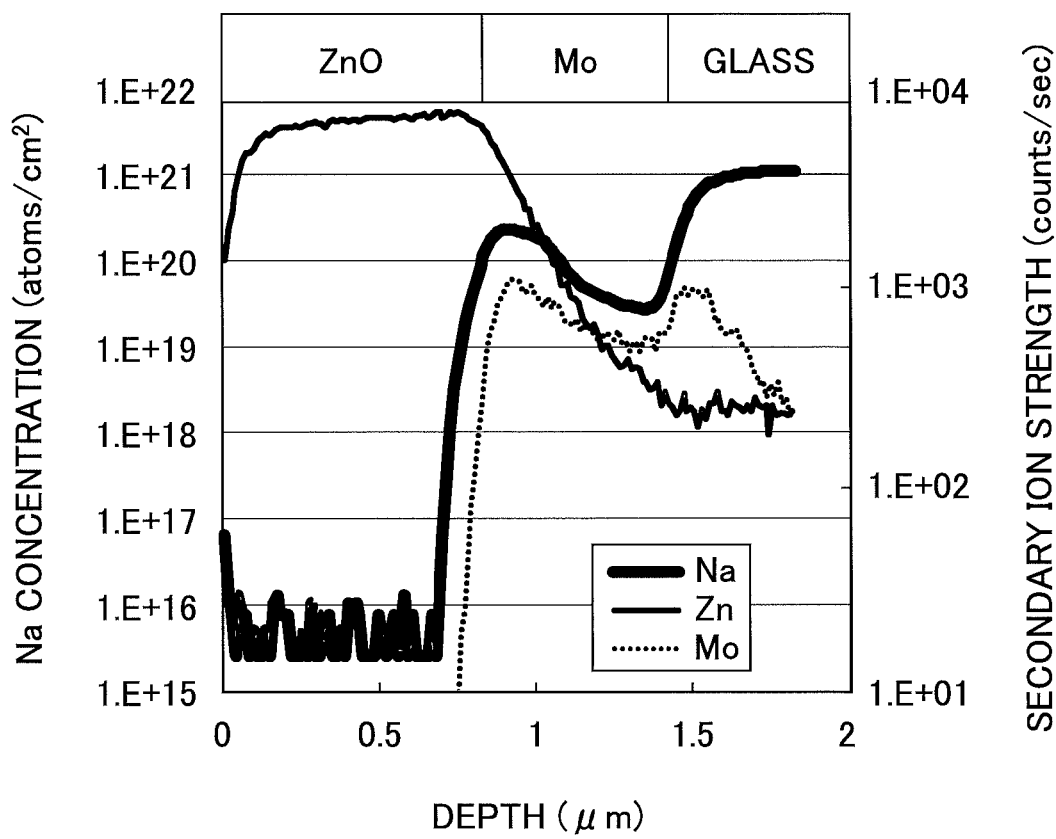
FIG. 12 is a diagram illustrating the effect of preventing alkali metal from spreading to a transparent conductive film due to alloying of alkali metal and a rear surface electrode layer (part 2).

Next, by using SIMS (Secondary Ion Mass Spectrometry), the concentrations of Na, Zn, and Mo are measured at the part of the division groove 13x of the sample 1 (comparative example 1) and at the part of the division groove 13x of the sample 4 (working example 2). Their results are illustrated in FIGS. 11 and 12. FIG. 11 is a diagram illustrating the effect of preventing alkali metal from spreading to the transparent conductive film due to alloying of the alkali metal and the rear surface electrode layer in sample 1 (comparative example 1). FIG. 12 is a diagram illustrating the effect of preventing alkali metal from spreading to the transparent conductive film due to alloying of the alkali metal and the rear surface electrode layer in sample 4 (comparative example 4).

With reference to FIGS. 11 and 12, the amount of Na included in a part of the transparent conductive film 14 indicated as ZnO of sample 4 (working example 2) is reduced compared to that of sample 1 (comparative example 1). Further, the amount of Na included in a part of the rear surface electrode layer 12 indicated as Mo of sample 4 (working example 2) is greater compared to that of sample 1 (comparative example 1). Accordingly, it can be understood that Na can be prevented from spreading to the transparent conductive film 14 by alloying the Na included in the rear surface electrode layer 12.

Hence, with the above-described embodiments and working examples of the present invention, the rear surface electrode layer 12 and the alkali metal (Na) included in the rear surface electrode layer 12 are alloyed at the front surface of the rear surface electrode layer 12 exposed in the division groove 13x during the forming of the division groove 13x by removing the light absorbing layer 13. As a result, the alkali metal included in the rear surface electrode layer 12 is prevented from spreading to the transparent conductive film 14 and increase of the resistivity of the transparent conductive film 14 is prevented. Thus, the fill factor FF and the conversion efficiency Eff can be improved. However, as described above, the forming of the division groove 13x and the alloying of Na may be performed in separate processes.

It is to be noted that a laser beam is to be radiated to the front surface of the rear surface electrode layer 12 exposed in the division groove 13x for alloying the rear surface electrode layer 12 and the alkali metal included in the rear surface electrode layer 12. Further, the laser used in this case is to be an infrared light having a wavelength of 1064 nm and a pulse width of 12 ns or more. However, other than a primary wavelength (1064 nm), a secondary harmonic wave (532 nm) or a third harmonic wave (355 nm) may also be used.

Further, the present invention is not limited to these embodiments, but variations and modifications may be made without departing from the scope of the present invention.

The present application claims priority of and is based on Japanese Priority Application No. 2011-257927 filed on Nov. 25, 2011, with the Japanese Patent Office, the entire contents of which are hereby incorporated by reference.

DESCRIPTION OF THE REFERENCE NUMERALS

10 CIS based thin-film solar cell module
11 substrate
11a first edge space
11b second edge space
12 rear surface electrode layer
12x, 13x, 14x division groove
13 light absorbing layer
14 transparent conductive layer
19 cell

The invention claimed is:

1. A method for manufacturing a thin-film solar cell module, comprising:
   a rear surface electrode layer deposition step for depositing a rear surface electrode layer on a substrate;
   an alkali metal adding step for adding an alkali metal to the rear surface electrode layer;
   a light absorbing layer deposition step for depositing a light absorbing layer on the rear surface electrode layer;
   a division groove forming step for forming a division groove that divides the light absorbing layer and exposing a front surface of the rear surface electrode layer in the division groove;
   an alloying step for alloying the rear surface electrode layer and the alkali metal on the front surface of the rear surface electrode layer exposed in the division groove; and
   a transparent conductive film deposition step for depositing a transparent conductive film on the light absorbing layer and in the division groove.

2. The method for manufacturing a thin-film solar cell module of claim 1, wherein the alkali metal adding step includes adding sodium (Na) as the alkali metal.

3. The method for manufacturing a thin-film solar cell module of claim 1,
   wherein the division groove forming step and the alloying step are performed in the same step,
   wherein the division groove is formed by radiating a laser beam to the light absorbing layer along with alloying the rear surface electrode layer and the alkali metal with the laser beam.

4. The method for manufacturing a thin-film solar cell module of claim 3,
   wherein the laser beam has a wavelength of 1064 nm, 532 nm, or 355 nm, and
   wherein the laser beam has a pulse width of 12 ns or more.

5. The method for manufacturing a thin-film solar cell module of claim 1,
   wherein the substrate is a glass substrate including the alkali metal;
   wherein the alkali metal adding step includes spreading the alkali metal included in the glass substrate to the rear surface electrode layer.

6. The method for manufacturing a thin-film solar cell module of claim 1,
   wherein the light absorbing layer deposition step includes depositing the light absorbing layer to which the alkali metal is added,
   wherein the alkali metal adding step includes spreading the alkali metal added to the light absorbing layer to the rear surface electrode layer.

7. The method for manufacturing a thin-film solar cell module of claim 1, wherein the alkali metal adding step includes adding the alkali metal directly to the rear surface electrode layer.

8. The method for manufacturing a thin-film solar cell module of claim 1, further comprising:
   a step for forming a second division groove that divides the rear surface electrode layer and exposing a front surface of the substrate in the second division groove;
   a step for forming a third division groove that divides the light absorbing layer and the transparent conductive film, exposing a front surface of the rear surface electrode layer in the third division groove, and forming a structure of serially connected multiple cells divided at the division groove, the second division groove, and the third division groove.

9. The method for manufacturing a thin-film solar cell module of claim 1, wherein the rear surface electrode layer includes molybdenum (Mo).

10. The method for manufacturing a thin-film solar cell module of claim 1, wherein the light absorbing layer includes at least copper (Cu), indium (In), and selenium (Se).

11. The method for manufacturing a thin-film solar cell module of claim 1, wherein the light absorbing layer includes at least copper (Cu), zinc (Zn), tin (Sn), and a chalcogen element (selenium (Se) or sulfur (S)).

12. the method for manufacturing a thin-film solar cell module of claim 1,
   wherein the alloying step includes radiating a laser beam to the light absorbing layer,
   wherein the laser beam has a pulse width that is 12 ns or more, and
   wherein the laser beam has a wavelength of 1064 nm, 532 nm, or 355 nm.

13. The method for manufacturing a thin-film solar cell module of claim 12, wherein the division groove forming step includes mechanically scribing the light absorbing layer.

14. The method for manufacturing a thin-film solar cell module of claim 13,
   wherein the division groove forming step includes radiating another laser beam to the light absorbing layer, and
   wherein the another laser beam has a pulse width that is less than 12 ns.

15. The method for manufacturing a thin-film solar cell module of claim 9,
   wherein the alkali metal adding step includes adding sodium (Na) as the alkali metal,
   wherein the division groove forming step and the alloying step are performed in the same step,
   wherein the division groove is formed by radiating a laser beam to the light absorbing layer along with alloying the rear surface electrode layer and the alkali metal with the laser beam, and wherein the laser beam has a wavelength of 1064 nm, 532 nm, or 355 nm, and
wherein the laser beam has a pulse width of 12 ns or more.

\* \* \* \* \*